(12) United States Patent
Aoki (10) Patent No.: US 12,404,389 B2
(45) Date of Patent: Sep. 2, 2025

(54) THERMOSETTING COMPOSITION, RESIN SHEET, METAL FOIL WITH RESIN, METAL-CLAD LAMINATE, AND PRINTED WIRING BOARD

(71) Applicant: PANASONIC INTELLECTUAL PROPERTY MANAGEMENT CO., LTD., Osaka (JP)

(72) Inventor: Kouichi Aoki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/665,379

(22) Filed: May 15, 2024

(65) Prior Publication Data

US 2024/0301173 A1    Sep. 12, 2024

Related U.S. Application Data

(62) Division of application No. 17/572,225, filed on Jan. 10, 2022, now abandoned, which is a division of (Continued)

(30) Foreign Application Priority Data

Aug. 2, 2017 (JP) .................................. 2017-150061

(51) Int. Cl.
*C08K 9/04* (2006.01)
*B32B 15/06* (2006.01)
(Continued)

(52) U.S. Cl.
CPC ................ *C08K 9/04* (2013.01); *B32B 15/06* (2013.01); *B32B 15/20* (2013.01); *B32B 25/02* (2013.01);
(Continued)

(58) Field of Classification Search
CPC ... C08K 9/04; C08K 3/36; C08K 9/06; C08K 5/34924; B32B 15/06; B32B 15/20;
(Continued)

(56) References Cited

U.S. PATENT DOCUMENTS 6,011,088 A * 1/2000 Yanagisawa ............. C08K 9/06
                                                      524/588
6,048,807 A   4/2000 Landi
(Continued)

FOREIGN PATENT DOCUMENTS

CN    103709718 A  *  4/2014
CN    106398173 A     2/2017
(Continued)

OTHER PUBLICATIONS

English translation JP 2007099957A (Year: 2007).*
(Continued)

*Primary Examiner* — Alicia Bland
(74) *Attorney, Agent, or Firm* — GREENBLUM & BERNSTEIN, P.L.C.

(57) ABSTRACT

A resin sheet includes a dried product or semi-cured product of a thermosetting composition, the thermosetting composition including an ethylene-propylene-diene copolymer as Component (A); and an inorganic filler, as Component (B), surface-treated with a surface treatment agent having a polymerizable unsaturated bond.

5 Claims, 3 Drawing Sheets

Related U.S. Application Data application No. 16/634,771, filed as application No. PCT/JP2018/028730 on Jul. 31, 2018, now abandoned.

(51) Int. Cl.

| | |
|---|---|
| *B32B 15/20* | (2006.01) |
| *B32B 25/02* | (2006.01) |
| *B32B 25/08* | (2006.01) |
| *B32B 25/16* | (2006.01) |
| *B32B 27/28* | (2006.01) |
| *C08J 5/18* | (2006.01) |
| *C08K 3/36* | (2006.01) |
| *C08L 23/16* | (2006.01) |
| *H05K 1/03* | (2006.01) |
| *H05K 3/02* | (2006.01) |

(52) U.S. Cl.
CPC .............. *B32B 25/08* (2013.01); *B32B 25/16* (2013.01); *B32B 27/285* (2013.01); *C08J 5/18* (2013.01); *C08K 3/36* (2013.01); *C08L 23/16* (2013.01); *H05K 1/036* (2013.01); *B32B 2264/102* (2013.01); *B32B 2307/206* (2013.01); *B32B 2457/08* (2013.01); *C08J 2323/16* (2013.01); *C08J 2423/16* (2013.01); *C08L 2203/202* (2013.01); *C08L 2205/025* (2013.01); *H05K 3/022* (2013.01); *H05K 2201/0195* (2013.01)

(58) Field of Classification Search
CPC ......... B32B 25/02; B32B 25/08; B32B 25/16; B32B 27/285; B32B 2264/102; B32B 2307/206; B32B 2457/08; B32B 27/08; B32B 2260/046; B32B 2262/101; B32B 15/088; B32B 2260/023; B32B 2307/732; B32B 5/02; B32B 5/26; B32B 15/08; B32B 15/14; B32B 27/34; B32B 27/281; C08J 5/18; C08J 2323/16; C08J 2423/16; C08L 23/16; C08L 2203/202; C08L 2205/025; H05K 1/036; H05K 3/022; H05K 2201/0195; H05K 2201/0209

See application file for complete search history.

(56) References Cited

U.S. PATENT DOCUMENTS

| | | | |
|---|---|---|---|
| 2003/0124284 A1* | 7/2003 | Ikemoto | ................. B32B 25/04 428/36.8 |
| 2015/0210884 A1 | 7/2015 | Hayashi et al. | |
| 2017/0029619 A1* | 2/2017 | Lin | ..................... H05K 1/0373 |
| 2018/0258324 A1 | 9/2018 | Tochihira et al. | |

FOREIGN PATENT DOCUMENTS

| | | | |
|---|---|---|---|
| JP | 10-218886 A | | 8/1998 |
| JP | 2002-523524 A | | 7/2002 |
| JP | 2005-239997 A | | 9/2005 |
| JP | 2007099957 A | * | 4/2007 |
| JP | 2011-095731 A | | 5/2011 |
| JP | 2013-018847 A | | 1/2013 |
| WO | 00/010368 A1 | | 2/2000 |
| WO | 2014/038534 A1 | | 3/2014 |
| WO | 2016/117554 A1 | | 7/2016 |

OTHER PUBLICATIONS

English translation CN 103709718A (Year: 2013).*
Office Action issued in JP Patent Application No. 2019-534543, Apr. 13, 2021, translation.
ISR issued in International Patent Application No. PCT/JP2018/028730, Oct. 16, 2018, translation.
Office Action issued in CN Patent Application No. 201880050154.8, Jan. 14, 2022, translation.

* cited by examiner

THERMOSETTING COMPOSITION, RESIN SHEET, METAL FOIL WITH RESIN, METAL-CLAD LAMINATE, AND PRINTED WIRING BOARD

CROSS-REFERENCE TO RELATED APPLICATIONS

This application is a Divisional of U.S. patent application Ser. No. 17/572,225, filed Jan. 10, 2022, which is a Divisional of U.S. patent application Ser. No. 16/634,771, filed Jan. 28, 2020, which is a National Stage Entry of International Patent Application No. PCT/JP2018/028730, filed Jul. 31, 2018, which claims the benefit of Japanese Patent Application No. 2017-150061, filed Aug. 2, 2017. The disclosure of each of the applications listed above is incorporated by reference herein in its entirety.

TECHNICAL FIELD

The present disclosure generally relates to a thermosetting composition, a resin sheet, a sheet of metal foil with resin, a metal-clad laminate, and a printed wiring board, and more particularly relates to a thermosetting composition, a resin sheet including a dried product or semi-cured product of the thermosetting composition, a sheet of metal foil with resin having a resin layer including a semi-cured product of the thermosetting composition, a metal-clad laminate with an insulating layer including a cured product of the thermosetting composition, and a printed wiring board with an insulating layer including a cured product of the thermosetting composition.

BACKGROUND ART

Various techniques for conveying information at even higher speeds have been developed continuously. To obtain a printed wiring board with the capability of processing such high-speed signals for such purposes, there has been an increasing demand for further lowering the dielectric constant and dielectric loss tangent of an insulating layer of the printed wiring board.

For example, Patent Literature 1 discloses, as a material for an insulating layer of a printed wiring board, a thermosetting adhesive composition containing, at a predetermined ratio: a vinyl compound having a polyphenylene ether skeleton; a maleimide resin having two or more maleimide groups; and an elastomer composed mainly of a polyphenylene skeleton and serving as a copolymer of a polyolefin block and a polystyrene block. Patent Literature 1 describes that this thermosetting adhesive composition has a low dielectric constant and a low dielectric loss tangent, exhibits high adhesive strength to an LCP film and copper foil, and has high heat resistance (see, for example, paragraph of Patent Literature 1).

CITATION LIST

Patent Literature

Patent Literature 1: WO 2016/117554 A1

SUMMARY OF INVENTION

It is therefore an object of the present disclosure to provide: a thermosetting composition, of which a cured product is able to have a low dielectric constant, a low dielectric loss tangent, high heat resistance, and excellent adhesiveness to a resin; a resin sheet including a dried product or semi-cured product of the thermosetting composition; a sheet of metal foil with resin having a resin layer including a semi-cured product of the thermosetting composition; a metal-clad laminate with an insulating layer including a cured product of the thermosetting composition; and a printed wiring board with an insulating layer including a cured product of the thermosetting composition.

A thermosetting composition according to an aspect of the present disclosure contains: an ethylene-propylene-diene copolymer as Component (A); and an inorganic filler, as Component (B), surface-treated with a surface treatment agent having a polymerizable unsaturated bond.

A resin sheet according to another aspect of the present disclosure includes a dried product or semi-cured product of the thermosetting composition.

A sheet of metal foil with resin according to still another aspect of the present disclosure includes: a sheet of metal foil; and a resin layer laid on top of the sheet of metal foil. The resin layer includes a dried product or semi-cured product of the thermosetting composition.

A metal-clad laminate according to still another aspect of the present disclosure includes: an insulating layer; and a sheet of metal foil. The insulating layer includes a cured product of the thermosetting composition.

A printed wiring board according to yet another aspect of the present disclosure includes: an insulating layer; and conductor wiring. The insulating layer includes a cured product of the thermosetting composition.

DESCRIPTION OF EMBODIMENTS

An exemplary embodiment of the present disclosure will be described below.

When used in applications demanding high reliability such as onboard applications, the printed wiring board is required to have even higher performance. With this regard, the heat resistance of the thermosetting adhesive composition disclosed in WO 2016/117554 A1 and its adhesiveness to resin are not high enough to achieve this.

Thus, the present inventors carried out extensive research and development to provide a thermosetting composition, of which a cured product is able to have a low dielectric constant, a low dielectric loss tangent, high heat resistance, and excellent adhesiveness to a resin, thereby acquiring an idea that forms the basis of the exemplary embodiment to be described below.

1. Overview

A thermosetting composition according to an exemplary embodiment (hereinafter referred to as "Composition (X)") contains: an ethylene-propylene-diene copolymer as Component (A); and an inorganic filler, as Component (B), surface-treated with a surface treatment agent having a polymerizable unsaturated bond. A cured product of this Composition (X) is able to have a low dielectric constant, a low dielectric loss tangent, high heat resistance, and excellent adhesiveness to metals and resins. Therefore, the Composition (X) is suitably applicable as a material for making the insulating layer of a metal-clad laminate and a printed wiring board. In that case, the Composition (X) is able to give good radio frequency characteristics and high reliability to the printed wiring board.

This embodiment achieves the advantage of providing: a thermosetting composition, of which a cured product is able to have a low dielectric constant, a low dielectric loss tangent, high heat resistance, and excellent adhesiveness to a resin; a resin sheet including a dried product or semi-cured product of the thermosetting composition; a sheet of metal foil with resin having a resin layer including a semi-cured product of the thermosetting composition; a metal-clad laminate with an insulating layer including a cured product of the thermosetting composition; and a printed wiring board with an insulating layer including a cured product of the thermosetting composition.

2. Composition (X)

Next, the components of the Composition (X) will be described in detail.

The ethylene-propylene-diene copolymer as Component (A) is generally also called "EPDM (ethylene-propylene-diene monomer) rubber."

The ethylene-propylene-diene copolymer as Component (A) has a structural unit derived from ethylene (hereinafter referred to as an "ethylene unit"), a structural unit derived from propylene (hereinafter referred to as a "propylene unit"), and a structural unit derived from diene (hereinafter referred to as a "diene unit"). The diene unit suitably includes a structural unit derived from 5-ethylidene-2-norbornene (hereinafter simply referred to as "5-ethylidene-2-norbornene"). That is to say, the ethylene-propylene-diene copolymer as Component (A) suitably includes the component expressed by the following Formula (1), where n, m, and l are natural numbers indicating the numbers of structural units in Formula (1). That is to say, Formula (1) indicates that one molecule of the copolymer as Component (A) includes n ethylene units, m propylene units, and l 5-ethylidene-2-norbornene units as diene units. The 5-ethylidene-2-norbornene unit as a diene unit contributes to increasing the curing reaction rate of the Composition (X), thus shortening the amount of time it takes to cure the Composition (X). Note that the structural unit included in the diene unit is not necessarily the 5-ethylidene-2-norbornene unit. Alternatively, the diene unit may also include at least one structural unit selected from the group consisting of the 5-ethylidene-2-norbornene unit, a dicyclopentadiene unit, and a 1,4-hexadiene unit.

[Formula 1]

The percentage by mass of the diene unit to the entire ethylene-propylene-diene copolymer as Component (A) is suitably equal to or greater than 3% by mass, which would contribute to improving the heat resistance of the cured product. The percentage of the diene unit more suitably falls within a range from 3% by mass to 15% by mass.

The percentage by mass of the ethylene unit to the entire ethylene-propylene-diene copolymer as Component (A) is suitably equal to or greater than 50% by mass. This facilitates forming the Composition (X) into a sheet shape. The percentage of the ethylene unit more suitably falls within a range from 50% by mass to 75% by mass.

The Mooney viscosity ML (1+4) 100° C., defined by JIS K6300-1:2013, of the ethylene-propylene-diene copolymer as Component (A) is suitably equal to or greater than 10. This also facilitates forming the Composition (X) into a sheet shape. The Mooney viscosity ML (1+4) 125° C., defined by JIS K6300-1:2013, of the ethylene-propylene-diene copolymer as Component (A) is more suitably equal to or less than 80.

Note that the larger the molecular weight of the ethylene-propylene-diene copolymer as Component (A) is, the higher the Mooney viscosity of the ethylene-propylene-diene copolymer as Component (A) is. Thus, the Mooney viscosity of the ethylene-propylene-diene copolymer as Component (A) is controllable by adjusting the molecular weights of the molecules included in the ethylene-propylene-diene copolymer as Component (A), or by blending molecules with different molecular weights with the ethylene-propylene-diene copolymer as Component (A) and adjusting the blending ratio thereof, or by turning the molecules included in the ethylene-propylene-diene copolymer as Component (A) into a branched structure.

The Composition (X) may contain not only the ethylene-propylene-diene copolymer as Component (A) but also an organic compound having a polymerizable unsaturated group as Component (C). The polymerizable unsaturated group includes at least one group selected from the group consisting of a vinyl group, an allyl group, a methallyl group, a styryl group, a meth(acrylic) group, and a maleimide group. When the Composition (X) contains an organic compound as Component (C), the physical properties of the Composition (X) and a cured product thereof are controllable by selecting appropriate components included in the organic compound as Component (C). For example, if the organic compound as Component (C) contains a monofunctional compound including a single polymerizable unsaturated group per molecule, then the monofunctional compound is able to reduce the melt viscosity of the Composition (X) to improve the formability. On the other hand, if the organic compound as Component (C) contains a polyfunctional compound including a plurality of polymerizable unsaturated groups per molecule, then the polyfunctional compound is able to increase the crosslink density of the cured product. Thus, the polyfunctional compound contributes to increasing the toughness, the glass transition temperature, and therefore, the heat resistance of the cured product, decreasing the linear expansion coefficient thereof, and increasing the degree of adhesiveness thereof.

If the organic compound as Component (C) contains a polyfunctional compound with a plurality of polymerizable unsaturated groups, then the polyfunctional compound includes at least one compound selected from the group consisting of: the compound expressed by the following Chemical Formula (2); bismaleimide; divinylbenzene; trivinylcyclohexane; triallyl isocyanurate (TAIC); dicyclopentadiene dimethanol dimethacrylate, and nonanediol dimethacrylate. The polyfunctional compound may include either the compound expressed by the following Formula (2) or bismaleimide, or both. In Formula (2), R is a single-bond organic group or a divalent organic group, and the organic group may be a hydrocarbon group, for example. Examples of the compounds expressed by the following Formula (2) include DD-1 manufactured by Shikoku Chemicals Corporation. If the polyfunctional compound includes bismaleimide, the bismaleimide includes at least one compound selected from the group consisting of: 4,4'-diphenylmethane bismaleimide; m-phenylene bismaleimide; bisphenol A diphenyl ether bismaleimide; 3,3'-dimethyl-5,5'-diethyl-4,4'-diphenylmethane bismaleimide; 4-methyl-1,3-phenylene bismaleimide; 1,6-bismaleimide-(2,2,4-trimethyl) hexane; and BMI-689, which is the name of a product manufactured by DESIGNER MOLECULES.

[Formula (2)]

(2)

If the Composition (X) contains the organic compound as Component (C), then the content of the organic compound as Component (C) suitably falls within a range from 1 part by mass to 100 parts by mass, and more suitably falls within a range from 10 part by mass to 100 parts by mass, relative to 100 parts by mass of the ethylene-propylene-diene copolymer as Component (A). When the content of the organic compound as Component (C) is equal to or greater than 1 part by mass, the organic compound as Component (C) contributes particularly effectively to improving the physical properties of the Composition (X) or a cured product thereof. For example, when the organic compound (C) includes a polyfunctional compound and the content of the polyfunctional compound is equal to or greater than 1 part by mass, the polyfunctional compound contributes to increasing the toughness, the glass transition temperature, and therefore, the heat resistance of the cured product, decreasing the linear expansion coefficient thereof, and increasing the degree of adhesiveness thereof. In addition, when the content of the organic compound as Component (C) is equal to or less than 100 parts by mass, an increase in the dielectric constant of the cured product is reducible.

The inorganic filler as Component (B) may contain at least one material selected from the group consisting of silica, alumina, talc, aluminum hydroxide, magnesium hydroxide, titanium oxide, mica, aluminum borate, barium sulfate, boron nitride, forsterite, zinc oxide, magnesium oxide, and calcium carbonate.

As described above, the inorganic filler as Component (B) has been subjected to surface treatment using a surface treatment agent having a polymerizable unsaturated bond. The polymerizable unsaturated bond includes at least one group selected from the group consisting of a vinyl group, an allyl group, a methallyl group, a styryl group, an acryloyl group, a meth(acryloyl) group, and a maleimide group. The surface treatment agent includes a silane coupling agent having a polymerizable unsaturated bond, for example.

The inorganic filler as Component (B) contributes to improving the dielectric properties, heat resistance, flame retardant properties, and toughness of the cured product and reducing the thermal expansion coefficient thereof. In addition, since the inorganic filler as Component (B) has been subjected to a surface treatment using a surface treatment agent, the inorganic filler has polymerizable unsaturated bonds on the surface thereof. That is why when the Composition (X) is cured, the polymerizable unsaturated bond of the inorganic filler as Component (B) and the ethylene-propylene-diene copolymer as Component (A) may react to each other, thus causing an increase in the crosslink density of the cured product. This allows the inorganic filler as Component (B) to contribute to improving the heat resistance of the cured product particularly effectively.

The content of the inorganic filler as Component (B) suitably falls within a range from 30 parts by mass to 500 parts by mass relative to 100 parts by mass of an organic component having thermosetting properties of the Composition (X) (hereinafter simply referred to as "thermosetting components"). As used herein, the "content of the inorganic filler as Component (B)" refers to the content of the inorganic filler as Component (B) that has already been subjected to the surface treatment using a surface treatment agent with polymerizable unsaturated bonds, i.e., the content of the inorganic filler as Component (B) including the surface treatment agent. Meanwhile, the thermosetting component refers herein to a component that polymerizes while the Composition (X) is heated to turn into a cured product. The thermosetting component includes the ethylene-propylene-diene copolymer as Component (A). When the Composition (X) includes the organic compound as Component (C), the thermosetting component naturally includes the organic compound as Component (C). Nevertheless, the surface treatment agent of the inorganic filler as Component (B) is not counted among the thermosetting components. If the content of the inorganic filler as Component (B) is equal to or greater than 30 parts by mass, the inorganic filler as Component (B) contributes even more effectively to improving the heat resistance of the cured product. The content of the inorganic filler as Component (B) is more suitably equal to or greater than 50 parts by mass. The content of the inorganic filler as Component (B) is also suitably equal to or greater than 100 parts by mass. In that case, the inorganic filler as Component (B) contributes particularly effectively to reducing the linear expansion coefficient of the cured product. Also, if the content of the inorganic filler as Component (B) is equal to or less than 500 parts by mass, the relative dielectric constant of the cured product may be kept particularly low. The content of the inorganic filler as Component (B) is more suitably equal to or less than 350 parts by mass, and even more suitably equal to or less than 250 parts by mass.

Optionally, the Composition (X) may contain a thermo-radical polymerization initiator. The thermo-radical polymerization initiator is able to promote the curing of the Composition (X) when the thermosetting composition is heated. Note that if the thermosetting component in the Composition (X) contains a component that readily produces an activate species when heated, then the Composition (X) may contain no thermo-radical polymerization initiators.

The thermo-radical polymerization initiator suitably contains an organic peroxide. The thermo-radical polymerization initiator may contain at least one component selected from the group consisting of: α, α'-bis (t-butylperoxy-m-isopropyl) benzene; 2,5-dimethyl-2,5-di (t-butylperoxy)-3-hexyne; benzoyl peroxide; 3,3',5,5'-tetramethyl-1,4-diphenoquinone; chloranil; 2,4,6-tri-t-butylphenoxyl; t-butylperoxyisopropyl monocarbonate; and azo-bisisobutyronitrile.

The content of the thermo-radical polymerization initiator may, but does not have to, fall within a range from 0.1 parts by mass to 3 parts by mass relative to 100 parts by mass of the entire thermosetting components in the Composition (X), for example.

Optionally, the Composition (X) may further contain any additive other than the components described above. The additive may include, for example, at least one component selected from the group consisting of: antifoaming agents such as silicone antifoaming agents and acrylic acid ester antifoaming agents; thermal stabilizers; antistatic agents; ultraviolet light absorbers; dyes; pigments; lubricants; and dispersing agents such as wetting and dispersing agents.

The Composition (X) may further contain a solvent as Component (D) as needed. The solvent as Component (D) suitably contains at least one component selected from the group consisting of: aliphatic hydrocarbon based solvents; aromatic hydrocarbon based solvents; and ketone based solvents. The Composition (X) containing a solvent improves the formability when the Composition (X) is formed into a sheet shape.

3. Resin Sheet

A resin sheet according to this embodiment includes a dried product or semi-cured product of the Composition (X). The resin sheet may be used as a material for making a laminate and a printed wiring board. That is to say, the resin sheet may be used to make a laminate with an insulating layer including a cured product of the resin sheet (i.e., an insulating layer including a cured product of the Composition (X)) and a printed wiring board with an insulating layer including a cured product of the resin sheet (i.e., an insulating layer including a cured product of the Composition (X)). Optionally, the resin sheet may also be used as a bonding sheet.

To make a resin sheet, the Composition (X) may be formed into a sheet shape by an application method, for example, and then heated to be dried or semi-cured. In this manner, a resin sheet including a dried product or semi-cured product of the Composition (X) is obtained. The heating temperature may fall within the range from 100° C. to 160° C., for example, and the heating duration may fall within the range from 5 minutes to 10 minutes, for example.

Heating and curing the resin sheet allows an insulating layer including a cured product of the Composition (X) to be formed. The heating temperature may fall within the range from 160° C. to 200° C., for example, and is suitably from 180° C. to 200° C., and the heating duration may fall within the range from 30 minutes to 120 minutes, for example, and is suitably from 60 minutes to 120 minutes.

When the resin sheet is used as a bonding sheet, two base members may be bonded together with the resin sheet, for example. Each of the two base members may be a laminate or a printed wiring board, for example. Specifically, the Composition (X) may be applied onto a supporting film, for example, and formed into a sheet shape, and then heated to be dried or semi-cured, thus making a resin sheet. This resin sheet is laid on top of a base member (first base member) and then the supporting film is peeled from the resin sheet. Subsequently, another base member (second base member) is laid on top of the resin sheet. That is to say, the first base member, the resin sheet, and the second base member are stacked one on top of another in this order. Subsequently, the resin sheet is heated to be cured. This allows the first base member and the second base member to be bonded together via a cured product of the resin sheet.

4. Sheet of Metal Foil with Resin

A sheet of metal foil 1 with resin according to this embodiment includes a sheet of metal foil 10 and a resin layer 20 laid on top of the sheet of metal foil 10. The resin layer 20 includes a dried product or semi-cured product of the Composition (X).

The sheet of metal foil 10 may be a sheet of copper foil, for example. The sheet of metal foil 10 may have a thickness falling within the range from 2 μm to 105 μm, for example, and is suitably from 5 μm to 35 μm.

Figure 1A:
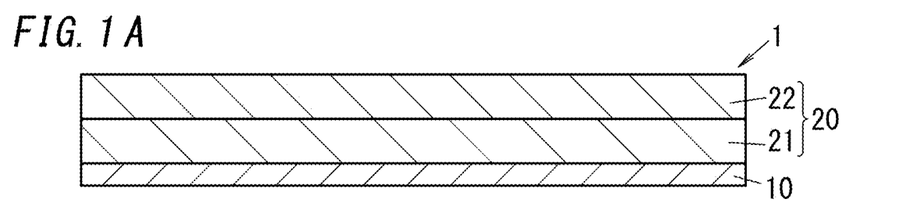
FIG. 1A is a schematic representation illustrating an exemplary sheet of metal foil with resin according to an exemplary embodiment of the present disclosure.
Figure 1B:
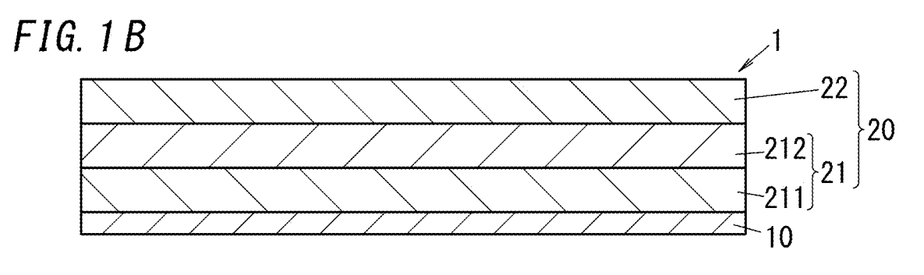
FIG. 1B is a schematic representation illustrating another exemplary sheet of metal foil with resin according to the exemplary embodiment of the present disclosure.

The resin layer 20 suitably includes a first resin layer 21 laid on top of the sheet of metal foil 10 and a second resin layer 22 laid on top of the first resin layer 21 as shown in FIGS. 1A and 1B. The first resin layer 21 includes at least one component selected from the group consisting of: a liquid crystal polymer resin; a polyimide resin; a polyamide imide resin; a fluorocarbon resin; and a polyphenylene ether resin. The second resin layer 22 includes a dried product or semi-cured product of the Composition (X). The first resin layer 21 may have a thickness falling within the range from 1 μm to 50 μm, for example. The second resin layer 22 may have a thickness falling within the range from 5 μm to 200 μm, and suitably has a thickness falling within the range from 10 μm to 150 μm.

In particular, it is recommended that the thickness of the first resin layer 21 fall within the range from 1 μm to 50 μm and the thickness of the second resin layer 22 fall within the range from 5 μm to 200 μm. In this case, setting the thickness of the first resin layer 21 at 1 μm or more increases the chances of an insulating layer made of the resin layer 20 exhibiting good electrical insulation properties. Meanwhile, setting the thickness of the first resin layer 21 at 50 μm or less increases the chances of the insulating layer made of the resin layer 20 having a sufficiently low dielectric constant and a sufficiently low dielectric loss tangent. Setting the thickness of the second resin layer 22 at 5 μm or more further increases the chances of the insulating layer made of the resin layer 20 having a sufficiently low dielectric constant and a sufficiently low dielectric loss tangent. Setting the thickness of the second resin layer 22 at 200 μm or less allows the insulating layer made of the resin layer 20 to exhibit sufficient flexibility.

A laminate or a printed wiring board, for example, may be made of the sheet of metal foil 1 with resin. In that case, an insulating layer may be made of the resin layer 20 of the sheet of metal foil 1 with resin, thus allowing the insulating layer to have a sufficiently low dielectric constant and a sufficiently low dielectric loss tangent. Particularly when the resin layer 20 includes the first resin layer 21 and the second resin layer 22, the insulating layer made up of the first resin layer 21 and the second resin layer 22 is allowed to have a sufficiently low dielectric constant and a sufficiently low dielectric loss tangent. In addition, the first resin layer 21 is further allowed to have good flexibility and there are slim chances that the cured product of the second resin layer 22 interferes with the flexibility of the first resin layer 21. This allows a flexible metal-clad laminate or printed wiring board to be formed using the sheet of metal foil 1 with resin.

The first resin layer 21 may be configured as a single layer as shown in FIG. 1A or may include a first layer 211 and a second layer 212 with mutually different compositions as shown in FIG. 1B. When the first resin layer 21 includes the first layer 211 and the second layer 212, each of the first layer 211 and second layer 212 includes at least one component selected from the group consisting of: a liquid crystal polymer resin; a polyimide resin; a polyamide imide resin; a fluorocarbon resin; and a polyphenylene ether resin, and the second layer 212 has a different composition from the first layer 211.

When the sheet of metal foil 1 with resin is made, the first resin layer 21 is made from a resin solution containing a material resin or a sheet material containing the material resin. Optionally, the sheet material may include, as an internal member, a base member such as glass cloth and may be reinforced with the base member. The sheet material may be a prepreg, for example. The first resin layer 21 may be formed by, for example, providing the sheet of metal foil 10 first, applying a resin solution onto the sheet of metal foil 10, and then drying the resin solution. Alternatively, the first resin layer 21 may also be formed by laying the sheet materials on top of the sheet of metal foil 10 and then thermally pressing the sheet materials together.

If the first resin layer 21 contains a liquid crystal polymer resin, then the liquid crystal polymer resin may contain at least one component selected from the group consisting of: polycondensates of ethylene terephthalate and para-hydroxybenzoic acid; polycondensates of a phenol, phthalic acid, and para-hydroxybenzoic acid; and polycondensates of 2,6-hydroxynaphthoic acid and para-hydroxybenzoic acid. The first resin layer 21 may be formed by forming the liquid crystal polymer resin into a sheet shape, for example, to make a sheet material and then laying the sheet material on top of the sheet of metal foil.

If the first resin layer 21 contains a polyimide resin, then a resin solution containing the polyimide resin may be prepared in the following manner, for example. First, polyamide acid is produced by polycondensation of tetracarboxylic dianhydride and a diamine component. The tetracarboxylic dianhydride suitably contains 3,3',4,4'-diphenyl sulfone tetracarboxylic dianhydride. The diamine component suitably includes a component selected from the group consisting of: 2,2-bis [4-(4-aminophenoxy) phenyl] propane; 4,4'-diaminodiphenyl ether; and bis [4-(4-aminophenoxy) phenyl]sulfone. Subsequently, the polyamide acid is heated in a solvent. The solvent contains at least one component selected from the group consisting of: N-methyl-2-pyrrolidone; methyl ethyl ketone; toluene; dimethyl acetamide; dimethylformamide; and methoxypropanol. In this heating process, the heating temperature may fall within the range from 60° C. to 250° C., and suitably falls within the range from 100° C. to 200° C. The heating duration may fall within the range from 0.5 hours to 50 hours. This causes the polyamide acid to turn into an imide through cyclization reaction, thus producing a polyimide resin. In this manner, a resin solution containing the polyimide resin is obtained.

The first resin layer 21 may be formed by applying the resin solution containing the polyimide resin onto the sheet of metal foil 10 and then heating and drying the resin solution.

If the first resin layer 21 contains a polyamide imide resin, then a resin solution containing the polyamide imide resin may be prepared in the following manner, for example. First, trimellitic anhydride, 4,4'-diisocyanato-3,3'-dimethylbiphenyl, tolylene-2,4-diisocyanate, diazabicycloundecene, and N, N-dimethylacetamide are mixed together to prepare a mixture. The mixture is then heated and the respective components are allowed to react to each other to obtain a mixture containing polyamide imide. Subsequently, the mixture is cooled. Then, bismaleimide is added to this mixture. In this manner, a resin solution containing polyamide imide is obtained.

The first resin layer 21 may be formed by, for example, applying the resin solution containing the polyamide imide resin onto the sheet of metal foil 10 and then heating and drying the resin solution.

If the first resin layer 21 contains a fluorocarbon resin, then the fluorocarbon resin may include polytetrafluoroethylene, for example.

If the first resin layer 21 contains a polyphenylene ether resin, then the first resin layer 21 is made of a resin composition containing a polyphenylene ether resin having a substituent group having carbon-carbon double bonds at terminals and a crosslink agent having carbon-carbon double bonds. The crosslink agent includes at least one component selected from the group consisting of: divinylbenzene; polybutadiene; alkyl (meth)acrylate; tricyclodecanol (meth) acrylate; fluorene (meth)acrylate; isocyanurate (meth)acrylate; and trimethylolpropane (meth)acrylate. The ratio by mass of the polyphenylene ether resin to the total of the polyphenylene ether resin and the crosslink agent may fall within the range from 65% by mass to 95% by mass.

The first resin layer 21 may be formed by, for example, applying the resin solution containing the polyphenylene ether resin and the crosslink agent having carbon-carbon double bonds onto the sheet of metal foil 10 and then thermally curing the resin solution.

If the first resin layer 21 includes the first layer 211 and the second layer 212, then the first resin layer 21 may be obtained by, for example, forming the first layer 211 and the second layer 212 in this order onto the sheet of metal foil 10 in the same way as described above. For example, first, a resin solution containing the component of the first layer 211 is applied onto the sheet of metal foil 10 and then dried to form the first layer 211. Next, a resin solution containing the component of the second layer 212 is applied onto the first layer 211 and then dried to form the second layer 212. Alternatively, the first resin layer 21 may also be formed by stacking a sheet material containing the component of the first layer 211 and a sheet material containing the component of the second layer 212 in this order on the sheet of metal foil 10 and then thermally pressing these sheet materials together.

The second resin layer 22 may be formed by, for example, forming the first resin layer 21 and applying the Composition (X) onto the first resin layer 21 and then heating, and drying or semi-curing, the Composition (X). Alternatively, the second resin layer 22 may also be formed by, for example, laying a resin sheet including a dried or semi-cured product of the Composition (X) that has been described for "3. Resin sheet" on top of the first resin layer 21. The second resin layer 22 may be formed by subjecting the Composition (X) to a heating process under the condition including a heating temperature falling within the range from 100° C. to 160° C. and a heating duration falling within the range from 5 minutes to 10 minutes, for example. In this manner, a sheet of metal foil 10 with resin is obtained.

Optionally, the first resin layer 21 may include three or more layers. For example, the first resin layer 21 may include a first layer, a second layer, and a third layer, which may be stacked one on top of another in this order. In that case, each of the first, second, and third layers contains at least one component selected from the group consisting of: a liquid crystal polymer resin; a polyimide resin; a polyamide imide resin; a fluorocarbon resin; and a polyphenylene ether resin. The second layer has a different composition from the first layer. The third layer has a different composition from the second layer. The third layer may have either a different composition from, or the same composition as, the first layer.

The resin layer 20 may also be a single layer including a dried product or semi-cured product of the Composition (X). In that case, the resin layer 20 may be formed by, for example, forming the Composition (X) into a sheet shape by application method, for example, onto the sheet of metal foil 10 and then heating, and drying or semi-curing, the Composition (X). In the heating process, the heating temperature may fall within the range from 100° C. to 160° C. and the heating duration may fall within the range from 5 minutes to 10 minutes.

5. Metal-Clad Laminate

A metal-clad laminate 2 according to this exemplary embodiment will be described.

As shown in FIGS. 2A-2D, the metal-clad laminate 2 includes an insulating layer 30 and the sheet of metal foil 10. The metal-clad laminate 2 includes the sheet of metal foil 10 as its outermost layer. The insulating layer 30 includes a cured product of the Composition (X). The insulating layer 30 suitably contains at least one component selected from the group consisting of: a liquid crystal polymer resin; a polyimide resin; a polyamide imide resin; a fluorocarbon resin; and a polyphenylene ether resin.

Figure 2A:
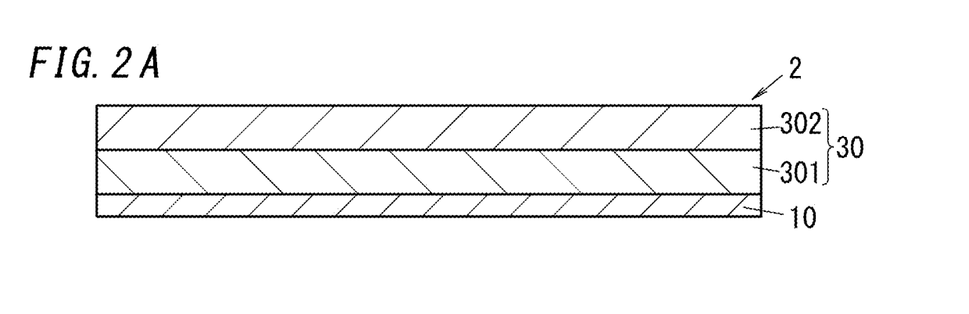
FIG. 2A is a schematic representation illustrating an exemplary metal-clad laminate according to the exemplary embodiment of the present disclosure.
Figure 2B:
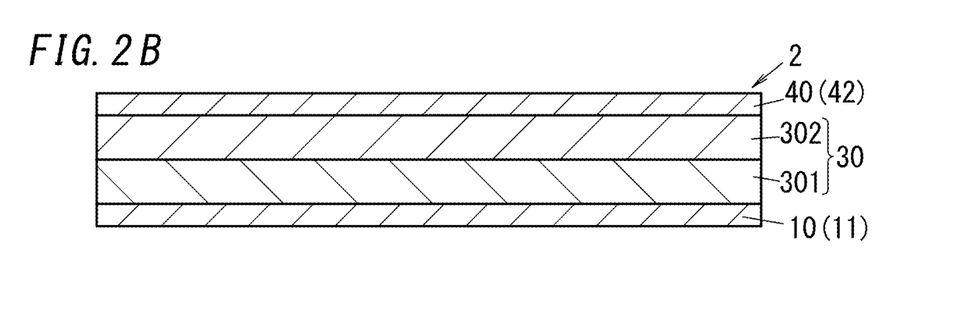
FIG. 2B is a schematic representation illustrating another exemplary metal-clad laminate according to the exemplary embodiment of the present disclosure.
Figure 2C:
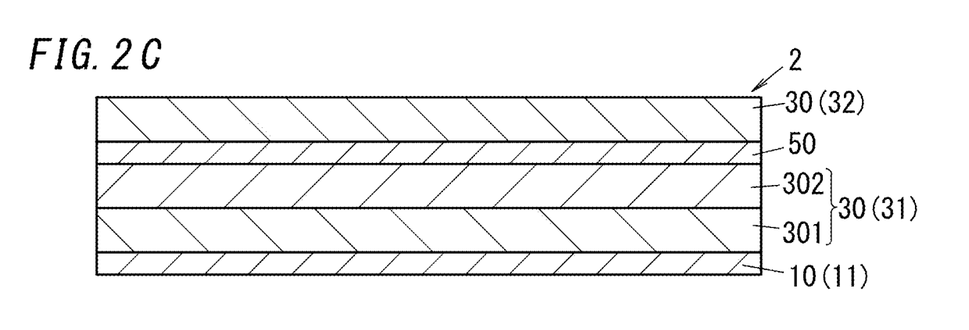
FIG. 2C is a schematic representation illustrating still another exemplary metal-clad laminate according to the exemplary embodiment of the present disclosure.
Figure 2D:
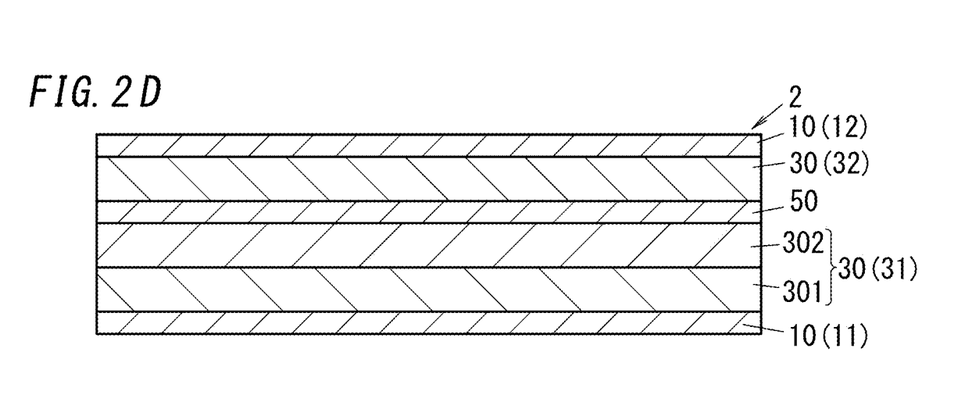
FIG. 2D is a schematic representation illustrating yet another exemplary metal-clad laminate according to the exemplary embodiment of the present disclosure.

The metal-clad laminate 2 may include two or more insulating layers 30 as shown in FIGS. 2C and 2D. In that case, at least one of the two or more insulating layers 30 may include a cured product of the Composition (X). Also, at least one of the two or more insulating layers 30 suitably contains at least one component selected from the group consisting of: a liquid crystal polymer resin; a polyimide resin; a polyamide imide resin; a fluorocarbon resin; and a polyphenylene ether resin. More suitably, each of the two or more insulating layers 30 contains at least one component selected from the group consisting of: a liquid crystal polymer resin; a polyimide resin; a polyamide imide resin; a fluorocarbon resin; and a polyphenylene ether resin.

The sheet of metal foil 10 may be a sheet of copper foil, for example. The sheet of metal foil 10 may have a thickness falling within the range from 2 μm to 105 μm, for example.

The insulating layers 30 may include a first layer 301 and a second layer 302 laid on top of the first layer 301. The first layer 301 contains at least one component selected from the group consisting of: a liquid crystal polymer resin; a polyimide resin; a polyamide imide resin; a fluorocarbon resin; and a polyphenylene ether resin. The second layer 302 includes a cured product of the Composition (X). Thus, the insulating layers 30 include the cured product of the Composition (X). The first layer 301 may have a thickness falling within the range from 1 μm to 50 μm, for example, and the second layer 302 may have a thickness falling within the range from 5 μm to 50 μm, for example. Optionally, the insulating layers 30 may also be configured as a single layer including a cured product of the Composition (X).

The metal-clad laminate 2, provided with the insulating layers 30 including the cured product of the Composition (X), allows the insulating layers 30 to have a sufficiently low dielectric constant and a sufficiently low dielectric loss tangent. This also allows the insulating layers 30 to have high heat resistance. In addition, since the cured product of the Composition (X) has good adhesiveness to resins and metals, the insulating layers 30 and the layers in contact with the insulating layers 30 may keep sufficiently close contact with each other.

The metal-clad laminate 2, provided with the first layer 301 and the second layer 302 described above as the insulating layers 30, allows the insulating layers 30 to have an even lower dielectric constant and an even lower dielectric loss tangent. This also allows the insulating layers 30 to have high heat resistance. In addition, since the cured product of the Composition (X) has good adhesiveness to resins and metals, the second layer 302 and the layers in contact with the second layer 302 may keep sufficiently close contact with each other.

The metal-clad laminates 2 shown in FIGS. 2A-2D will be described in further detail.

The metal-clad laminate 2 shown in FIG. 2A includes the sheet of metal foil 10, the first layer 301, and the second layer 302, which are stacked one on top of another in this order.

To manufacture the metal-clad laminate 2 shown in FIG. 2A, the first layer 301 may be formed by, for example, applying a resin solution containing the component of the first layer 301 onto the sheet of metal foil 10 and then drying the resin solution. Alternatively, the first layer 301 may also be formed by laying a sheet material containing the component of the first layer 301 on top of the sheet of metal foil 10 and then thermally pressing the sheet material.

Next, the second layer 302 may be formed by applying the Composition (X) onto the first layer 301, heating, and thereby drying or semi-curing, the Composition (X) under the condition including a heating temperature falling within the range from 100° C. to 160° C. and a heating duration falling within the range from 5 minutes to 10 minutes, and then further heating, and thereby curing, the Composition (X) under the condition including a heating temperature falling within the range from 160° C. to 200° C. and a heating duration falling within the range from 30 minutes to 120 minutes. In this manner, the metal-clad laminate 2 may be made.

Alternatively, the metal-clad laminate 2 may also be formed by stacking a sheet material containing the component of the first layer 301 and a resin sheet including a dried product or semi-cured product of the Composition (X) that has already been described for the "3. Resin sheet" section one on top of the other in this order on the sheet of metal foil 10 and then thermally pressing the sheet material and the resin sheet together.

Still alternatively, the metal-clad laminate 2 may also be made by heating the sheet of metal foil 1 with resin shown in FIG. 1A and thereby curing the second resin layer 22.

Optionally, in the metal-clad laminate 2 shown in FIG. 2A, the sheet of metal foil 10, the second layer 302, and the first layer 301 may be stacked one on top of another in this order. That is to say, the first layer 301 and the second layer 302 may be stacked in reverse order from the example illustrated in FIG. 2A. Furthermore, the first layer 301 may include two or more layers. In that case, two layers that are directly in contact with each other in the first layer 301 have mutually different compositions. Meanwhile, two layers that are not directly in contact with each other in the first layer 301 may have either the same composition or mutually different compositions.

Next, the metal-clad laminate 2 shown in FIG. 2B will be described. This metal-clad laminate 2 includes a sheet of metal foil 10 (first sheet of metal foil 11), the insulating layers 30, and another sheet of metal foil 10 (second sheet of metal foil 12), which are stacked one on top of another in this order. That is to say, the metal-clad laminate 2 shown in FIG. 2B has the same configuration as the metal-clad laminate 2 shown in FIG. 2A except that the metal-clad laminate 2 shown in FIG. 2B further includes the second sheet of metal foil 12.

The metal-clad laminate 2 shown in FIG. 2B may be formed by stacking the first sheet of metal foil 11, a sheet material containing the component of the first layer 301, a sheet material containing the component of the second layer 302, and the second sheet of metal foil 12 one on top of another in this order and then thermally pressing these members together.

Alternatively, the metal-clad laminate 2 may also be made by laying a sheet of metal foil on top of the second resin layer 22 of the sheet of metal foil 1 with resin shown in FIG. 1A and then thermally pressing them together. Optionally, the metal-clad laminate 2 shown in FIG. 2A may be obtained by completely etching away the second sheet of metal foil 12 from the metal-clad laminate 2 shown in FIG. 2B.

Another metal-clad laminate 2 according to this embodiment may include the sheet of metal foil 10, insulating layers 30 (first insulating layer 31), a conductor layer 50, and another insulating layer 30 (second insulating layer 32), which are stacked one on top of another in this order as shown in FIGS. 2C and 2D. In that case, the second insulating layer 32 suitably contains at least one component selected from the group consisting of: a liquid crystal polymer resin; a polyimide resin; a polyamide imide resin; a fluorocarbon resin; and a polyphenylene ether resin.

In the metal-clad laminate 2 shown in FIG. 2C, the first insulating layer 31 includes the first layer 301 and the second layer 302. The first insulating layer 31 may have the same configuration as the insulating layers 30 of the metal-clad laminate 2 shown in FIG. 2A. The conductor layer 50 may be either a sheet of metal foil or conductor wiring.

The metal-clad laminate 2 shown in FIG. 2C may be made by, for example, stacking the sheet of metal foil 10, a sheet material containing the component of the first layer 301, another sheet material containing the component of the second layer 302, the conductor layer 50, and still another sheet material containing the component of the second insulating layer 32 one on top of another in this order and then thermally pressing these members together.

Alternatively, the metal-clad laminate 2 shown in FIG. 2C may be formed of the sheet of metal foil 1 with resin shown in FIG. 1A and a base member including the conductor layer 50 and the second insulating layer 32. The conductor layer 50 is configured as either a sheet of metal foil or conductor wiring. For example, the metal-clad laminate 2 may be made by laying the conductor layer 50 of the base member on top of the second resin layer 22 of the sheet of metal foil 1 with resin and then thermally pressing them together.

Alternatively, the metal-clad laminate 2 may include the sheet of metal foil 10, the second layer 302, the first layer 301, the conductor layer 50, and the second insulating layer 32, which are stacked one on top of another in this order. That is to say, the first layer 301 and the second layer 302 may be stacked one upon the other in reverse order from the example shown in FIG. 2C.

The metal-clad laminate shown in FIG. 2D includes a sheet of metal foil 10 (first sheet of metal foil 11), the insulating layers 30 (first insulating layer 31), the conductor layer 50, the insulating layer 30 (second insulating layer 32), and another sheet of metal foil 10 (second sheet of metal foil 12), which are stacked one on top of another in this order. The first insulating layer 31 includes the first layer 301 and the second layer 302. That is to say, the metal-clad laminate 2 shown in FIG. 2D has the same configuration as the metal-clad laminate 2 shown in FIG. 2C except that the metal-clad laminate 2 shown in FIG. 2D further includes the second sheet of metal foil 12.

The metal-clad laminate 2 shown in FIG. 2D may be made by stacking the first sheet of metal foil 11, a sheet material containing the component of the first layer 301, another sheet material containing the component of the second layer 302, the conductor layer 50 as a sheet of metal foil, still another sheet material containing the component of the second insulating layer, and the second sheet of metal foil 12 one on top of another in this order and then thermally pressing these members together.

Alternatively, the metal-clad laminate 2 shown in FIG. 2D may also be formed of the sheet of metal foil 1 with resin shown in FIG. 1A and a base member including the conductor layer 50, the second insulating layer 32, and the second sheet of metal foil 12 that are stacked one on top of another in this order. The conductor layer 50 may be configured as either a sheet of metal foil or conductor wiring. The metal-clad laminate 2 may be made by laying the conductor layer 50 of the base member on top of the second resin layer 22 of the sheet of metal foil 1 with resin and then thermally pressing them together.

Optionally, the metal-clad laminate 2 may also be formed by using appropriate materials selected from the group consisting of a sheet of metal foil with resin, a single-sided metal-clad laminate, a double-sided metal-clad laminate, a sheet material, and a sheet of metal foil. For example, a base member including the first sheet of metal foil 11 and the first layer 301 laid on top of the first sheet of metal foil 11 (hereinafter referred to as a "first base member") is provided. In the meantime, a base member including the conductor layer 50 configured as a sheet of metal foil or conductor wiring, the second insulating layer 32, and the second sheet of metal foil 12, which are laid one on top of another in this order (hereinafter referred to as a "second base member") is also provided. The first layer 301 of the first base member and the conductor layer 50 of the second base member are arranged to face each other, the resin sheet described for "3. Resin sheet" section is interposed between these two layers, and then these members are thermally pressed together. This allows the second layer 302 to be formed by curing the resin sheet and the first base member and the second base member to be bonded together via the second layer 302, thus forming the metal-clad laminate 2.

Optionally, the metal-clad laminate 2 shown in FIG. 2C may be made by completely etching away the second sheet of metal foil 12 from the metal-clad laminate 2 shown in FIG. 2D, for example.

Note that the specific examples shown in FIGS. 2A-2D are only exemplary structures for the metal-clad laminate 2 and should not be construed as limiting. For example, the metal-clad laminate 2 may include one or more sheets of metal foil 10, two or more conductor layers 50, and three or more insulating layers 30. The conductor layer 50 is interposed between two adjacent ones of the insulating layers 30. The sheet of metal foil 10 forms the outermost layer of the metal-clad laminate 2. At least one of the three or more insulating layers 30 includes a cured product of the Composition (X). At least one of the three or more insulating layers 30 suitably contains at least one component selected from the group consisting of: a liquid crystal polymer resin; a polyimide resin; a polyamide imide resin; a fluorocarbon resin; and a polyphenylene ether resin. Particularly when the metal-clad laminate 2 includes an insulating layer 30 including either a polyimide resin or a polyamide imide resin, or both, the heat resistance and size stability of the metal-clad laminate 2 may further improve.

6. Printed Wiring Board

A printed wiring board 3 according to this embodiment will be described.

As shown in FIGS. 3A-3D, the printed wiring board 3 includes an insulating layer 30 and conductor wiring 60. The printed wiring board 3 includes the conductor wiring 60 as its outermost layer. The insulating layer 30 includes a cured product of the Composition (X). The insulating layer 30 suitably includes at least one component selected from the group consisting of: a liquid crystal polymer resin; a polyimide resin; a polyamide imide resin; a fluorocarbon resin; and a polyphenylene ether resin.

The printed wiring board 3 may include two or more insulating layers 30. In that case, at least one of the two or more insulating layers 30 may include a cured product of the Composition (X). Also, at least one of the two or more insulating layers 30 suitably includes at least one component selected from the group consisting of: a liquid crystal polymer resin; a polyimide resin; a polyamide imide resin; a fluorocarbon resin; and a polyphenylene ether resin. More suitably, each of the two or more insulating layers 30 includes at least one component selected from the group consisting of: a liquid crystal polymer resin; a polyimide resin; a polyamide imide resin; a fluorocarbon resin; and a polyphenylene ether resin.

The conductor wiring 60 may have a thickness falling within the range from 2 μm to 105 μm, for example. Examples of the conductor wiring 60 include a signal layer, a power supply layer, and a ground layer. The conductor wiring 60 may have an appropriate pattern. On the drawings attached herewith, the conductor wiring 60 is illustrated as a simplified one. Optionally, the insulating layer 30 may have a via metal.

The insulating layer 30 may include a first layer 301 and a second layer 302 laid on top of the first layer 301. The insulating layer 30 may have the same configuration as the insulating layer 30 of the metal-clad laminate 2 shown in any of FIGS. 2A-2D.

The printed wiring board 3 achieves the same advantages as the metal-clad laminate 2.

The printed wiring boards 3 shown in FIGS. 3A-3D will be described in further detail.

Figure 3A:
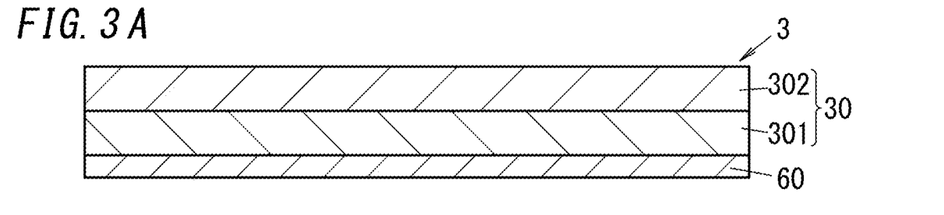
FIG. 3A is a schematic representation illustrating an exemplary printed wiring board according to the exemplary embodiment of the present disclosure.

The printed wiring board 3 shown in FIG. 3A includes the conductor wiring 60, the first layer 301, and the second layer 302, which are stacked one on top of another in this order. The printed wiring board 3 has the same configuration as the metal-clad laminate 2 shown in FIG. 2A, except that the printed wiring board 3 includes the conductor wiring 60 in place of the sheet of metal foil 10. This printed wiring board 3 may be made by forming the conductor wiring 60 by, for example, etching away excessive portions of the sheet of metal foil 10 of the metal-clad laminate 2 shown in FIG. 2A.

Figure 3B:
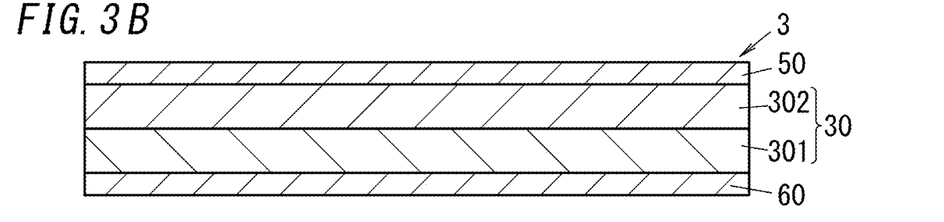
FIG. 3B is a schematic representation illustrating another exemplary printed wiring board according to the exemplary embodiment of the present disclosure.

The printed wiring board 3 shown in FIG. 3B includes the conductor wiring 60, the insulating layer 30, and a conductor layer 50, which are stacked one on top of another in this order. That is to say, the printed wiring board 3 shown in FIG. 3B has the same configuration as the printed wiring board 3 shown in FIG. 3A, except that the printed wiring board 3 shown in FIG. 3B further includes the conductor layer 50. The conductor layer 50 may be a sheet of metal foil or conductor wiring, whichever is appropriate. This printed wiring board 3 may be made by forming the conductor wiring 60 by, for example, etching away excessive portions of the first sheet of metal foil 11 of the metal-clad laminate 2 shown in FIG. 2B and/or by forming another conductor wiring by etching away excessive portions of the second sheet of metal foil 12 as well.

Figure 3C:
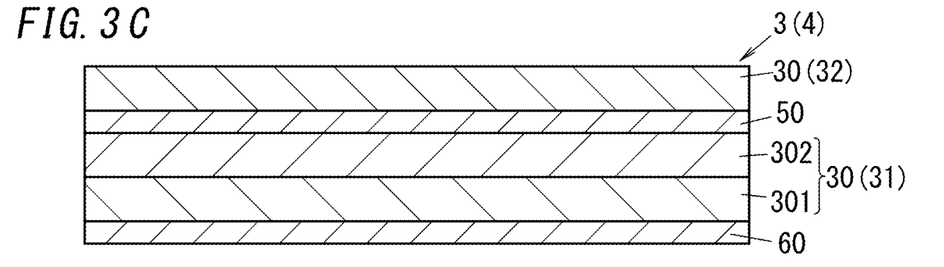
FIG. 3C is a schematic representation illustrating still another exemplary printed wiring board according to the exemplary embodiment of the present disclosure.
Figure 3D:
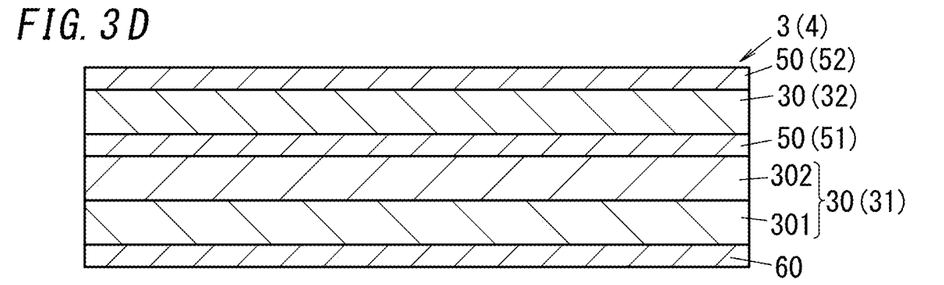
FIG. 3D is a schematic representation illustrating yet another exemplary printed wiring board according to the exemplary embodiment of the present disclosure.

Each of the printed wiring boards 3 shown in FIGS. 3C and 3D is a multilayer printed wiring board 4 including one or more conductor wirings 60 and two or more insulating layers 30. The multilayer printed wiring board 4 may be made using the sheet of metal foil with resin, laminate, or printed wiring board described above, for example.

The multilayer printed wiring board 4 shown in FIG. 3C includes the conductor wiring 60, an insulating layer 30 (first insulating layer 31), the conductor layer 50, and another insulating layer 30 (second insulating layer 32), which are stacked one on top of another in this order. The conductor layer 50 is configured as either a sheet of metal foil or conductor wiring. The insulating layer 30 includes a first layer 301 and a second layer 302. This multilayer printed wiring board 4 has the same configuration as the printed wiring board 3 shown in FIG. 3B except that the multilayer printed wiring board 4 further includes the second insulating layer 32 and has the same configuration as the metal-clad laminate 2 shown in FIG. 2C except that the multilayer printed wiring board 4 includes the conductor wiring 60 in place of the sheet of metal foil 10.

The multilayer printed wiring board 4 shown in FIG. 3C may be made by forming the conductor wiring 60 by, for example, etching away excessive portions of the sheet of metal foil 10 of the metal-clad laminate 2 shown in FIG. 2C.

The multilayer printed wiring board 4 shown in FIG. 3D includes the conductor wiring 60, an insulating layer 30 (first insulating layer 31), a conductor layer 50 (first conductor layer 51), another insulating layer 30 (second insulating layer 32), and another conductor layer 50 (second conductor layer 52), which are stacked one on top of another in this order. That is to say, the multilayer printed wiring board 4 shown in FIG. 3D has the same configuration as the multilayer printed wiring board 4 shown in FIG. 3C except that the multilayer printed wiring board 4 shown in FIG. 3D further includes the second conductor layer 52. Each of the first conductor layer 51 and the second conductor layer 52 may be configured as either a sheet of metal foil or conductor wiring, whichever is appropriate.

The multilayer printed wiring board 4 shown in FIG. 3D may be formed out of either the sheet of metal foil 1 with resin or the metal-clad laminate 2, for example. The multilayer printed wiring board 4 may be made by forming the conductor wiring 60 by, for example, etching away excessive portions of the first sheet of metal foil 11 of the metal-clad laminate 2 shown in FIG. 2D and/or forming another conductor wiring by, for example, etching away excessive portions of the second sheet of metal foil 12 thereof.

Note that the specific examples shown in FIGS. 3C and 3D illustrate only exemplary configurations for the multilayer printed wiring boards 4 and should not be construed as limiting. For example, the multilayer printed wiring board 4 may include three or more insulating layers 30.

Examples

Specific examples of the present disclosure will be presented below. Note that the following specific examples are only examples of the present disclosure and should not be construed as limiting.

1. Making Resin Sheet

A composition with a solid content concentration of 25% by mass was obtained by adding the components shown in the "Composition" column of Tables 1 and 2 to toluene.

Using a comma coater and a drier connected to the comma coater, the composition was applied onto a polyethylene terephthalate film with a thickness of 38 μm, and then heated at 110° C. for 5 minutes. In this manner, a resin sheet with a thickness of 25 μm was formed on the polyethylene terephthalate film.

Among the components shown in the "Material Composition" column of Tables 1 and 2, details of all components but the vinyl compound having a polyphenylene either skeleton are as follows:

- Copolymer 1: ethylene-propylene-diene copolymer having a Mooney viscosity (ML (1+4) 100° C.) of 15, an ethylene content of 72% by mass, and a diene content of 3.6% by mass, and a product number X-3012P manufactured by Mitsui Chemicals Inc.;
- Copolymer 2: ethylene-propylene-diene copolymer having a Mooney viscosity (ML (1+4) 100° C.) of 32, an ethylene content of 47% by mass, and a diene (5-ethylidene-2-norbornene) content of 9.5% by mass, and a product number 8030M manufactured by Mitsui Chemicals Inc.;
- Copolymer 3: ethylene-propylene-diene copolymer having a Mooney viscosity (ML (1+4) 125° C.) of 58, an ethylene content of 41% by mass, and a diene (5-ethylidene-2-norbornene) content of 14.0% by mass, and the product number 9090M manufactured by Mitsui Chemicals Inc.;
- Organic Compound 1 having a polymerizable unsaturated group: the compound expressed by Formula (2) and having the product number DD-1 manufactured by Shikoku Chemicals Corporation;
- Organic Compound 2 having a polymerizable unsaturated group: divinylbenzene manufactured by Tokyo Chemical Industry Co., Ltd.;
- Organic Compound 3 having a polymerizable unsaturated group: tricyclodecane dimethanol dimethacrylate having the product number DCP manufactured by Shin-Nakamura Chemical Co., Ltd.;
- Organic Compound 4 having a polymerizable unsaturated group: long-chain alkylbismaleimide having the product number BMI-689 manufactured by Molecular Design Inc.;
- Bismaleimide: product number BMI-1000 manufactured by Daiwa Fine Chemicals Co., Ltd.;
- Epoxy compound: product number NC-3000H manufactured by Nippon Kayaku Co., Ltd.;
- Elastomer 1: product name SEPTON™ V9827 manufactured by Kuraray Co., Ltd.;
- Elastomer 2: product name HYBRAR™ 7125 manufactured by Kuraray Co., Ltd.;
- Elastomer 3: product name HYBRAR™ 5127 manufactured by Kuraray Co., Ltd.;
- Inorganic Filler 1: spherical silica surface-treated with vinyl silane and having the product number 0.5 μm SV-CT1 (25% toluene containing slurry) manufactured by Admatechs;
- Inorganic Filler 2: spherical silica surface-treated with methacrylic silane and having the product number 0.5 μm SM-CT1 (25% toluene containing slurry) manufactured by Admatechs;
- Inorganic Filler 3: spherical silica surface-treated with phenyl silane and having the product number 0.5 μm SP-CT1 (25% toluene containing slurry) manufactured by Admatechs; and
- Thermo-Radical Polymerization Initiator: product name Perbutyl P manufactured by NOF Corporation.

Meanwhile, the vinyl compound having a polyphenylene ether skeleton was synthesized in the following manner. Into a three-neck flask having a capacity of 1 liter and provided with a temperature adjuster, a stirrer, a cooling system, and a dripping funnel, 200 g of polyphenylene ether (product number SA90 manufactured by SABIC Innovative Plastic, having an intrinsic viscosity of 0.083 dl/g, an average number of terminal hydroxyl groups of 1.9, and a number average molecular weight of 2,000), 30 g of 50:50 by mass mixture of p-chloromethylstyrene and m-chloromethylstyrene (product name chloromethylstyrene: CMS manufactured by Tokyo Chemical Industry Co., Ltd.), 1.227 g of phase-transfer catalyst (tetra-n-butyl ammonium bromide), and 400 g of toluene were introduced. The mixture of these components was gradually heated to 75° C. while being stirred up. Next, an aqueous solution of an alkali metal hydroxide (i.e., a mixture of 20 g of sodium hydroxide and 29 g of water) was dripped in 20 minutes into the three-neck flask. Subsequently, the content of the three-neck flask was stirred up at 75° C. for four hours. Thereafter, the content of the three-neck flask was neutralized with 10% by mass of hydrochloric acid, and then a lot of methanol was poured into the three-neck flask, thereby depositing the precipitate. The precipitate was separated by filtering the content of the three-neck flask. Thereafter, the precipitate was washed three times with a 80:20 by mass mixture of methanol and water, and then dried at 80° C. for three hours at a reduced pressure, thereby obtaining a product. When the product was analyzed with 1H-NMR (400 MHZ, CDCl3, TMS), a peak derived from ethenylbenzyl was confirmed within the range of 5 to 7 ppm. Thus, it was confirmed that the product was a vinyl compound with a polyphenylene ether skeleton having, at a terminal, a substituent group with carbon-carbon double bonds.

2. Evaluation Test 2-1. Dielectric Properties (Relative Dielectric Constant and Dielectric Loss Tangent)

Two sheets of copper foil, each having a thickness of 18 μm, were arranged so that the glossy surfaces thereof faced each other, and a resin sheet was interposed between the two sheets of copper foil. A sample was made by thermally pressing them for one hour under the condition including 200° C. and 2 MPa. This sample was subjected to an etching process to remove the two sheets of copper foil from both sides, thereby making a test piece of a cured product of the resin sheet. The relative dielectric constant and dielectric loss tangent of this test piece at a test frequency of 10 GHz were measured in accordance with the IPC TM-650 2.5.5.5. Note that one of the criteria of "low dielectric constant" according to this embodiment may be that the dielectric constant according to this test should be equal to or less than 3.0. It should also be noted that one of the criteria of "low dielectric loss tangent" according to this embodiment may be that the dielectric loss tangent according to this test should be equal to or less than 0.0025.

2-2. Peel Strength 1 (Peel Strength with Respect to Resin)

Two base members, each including a sheet of copper foil with a thickness of 12 μm and an insulating layer of polyamide imide with a thickness of 3 μm, were provided. These two base members were arranged so that their respective insulating layers faced each other, and a resin sheet was interposed between the two insulating layers. A sample was made by thermally pressing them for one hour under the condition including 200° C. and 2 MPa. A 90° peel strength of the cured product of the resin sheet with respect to the insulating layer of polyamide imide of this sample was measured. Note that one of criteria of "high degree of adhesiveness with respect to resin" according to this embodiment may be that the peel strength according to this test should be equal to or greater than 0.5 N/mm.

2-3. Peel Strength 2 (Peel Strength with Respect to Metal)

A base member including a sheet of copper foil with a thickness of 12 μm and an insulating layer of polyamide imide with a thickness of 3 μm, and a sheet of copper foil with a thickness of 12 μm were provided. The base member and the sheet of copper foil were arranged so that the insulating layer of the base member and the sheet of copper foil faced each other, and a resin sheet was interposed between the insulating layer and the sheet of copper foil. A sample was made by thermally pressing them for one hour under the condition including 200° C. and 2 MPa. A 90° peel strength of the cured product of the resin sheet with respect to the sheet of coper foil of this sample was measured. Note that one of criteria of "high degree of adhesiveness with respect to metal" according to this embodiment may be that the peel strength according to this test should be equal to or greater than 0.5 N/mm.

2-4. Solder Heat Resistance 1

A sample was made in the same way as in the "Peel Strength 1" test described above. A test piece was formed out of the sample in accordance with the JIS C6471 standard. Specifically, the test piece was lifted after having been floated on solder baths at 260° C. and 300° C. for three minutes and then had its appearance observed. When no swelling, peeling, or any other abnormality was observed at a solder bath temperature of 260° C. or 300° C., the solder heat resistance was evaluated "A." When no abnormality was observed at a solder bath temperature of 260° C. but an abnormality was observed at a solder bath temperature of 300° C., the solder heat resistance was evaluated "B." When an abnormality was observed at both of solder bath temperatures of 260° C. and 300° C., the solder heat resistance was evaluated "C." Note that one of criteria of "high heat resistance" according to this embodiment may be that the evaluation according to this test should be "A" or "B."

2-5. Solder Heat Resistance 2

A sample was made in the same way as in the "Peel Strength 2" test described above. A test piece was formed out of the sample in accordance with the JIS C6471 standard. Specifically, the test piece was lifted after having been floated on solder baths at 260° C. and 300° C. for three minutes and then had its appearance observed. When no swelling, peeling, or any other abnormality was observed at a solder bath temperature of 260° C. or 300° C., the solder heat resistance was evaluated "A." When no abnormality was observed at a solder bath temperature of 260° C. but an abnormality was observed at 300° C., the solder heat resistance was evaluated "B." When an abnormality was observed at both of 260° C. and 300° C., the solder heat resistance was evaluated "C." Note that one of criteria of "high heat resistance" according to this embodiment may be that the evaluation according to this test should be "A" or "B."

TABLE 1

|  |  | Example | | | | | | |
|---|---|---|---|---|---|---|---|---|
|  |  | 1 | 2 | 3 | 4 | 5 | 6 | 7 |
| Composition (parts by mass) | Copolymer 1 | 60 | 60 | 60 | 60 | 60 | 60 | 60 |
|  | Copolymer 2 | 20 | 20 | 20 | 20 | 20 | 20 |  |
|  | Copolymer 3 |  |  |  |  |  |  | 40 |
|  | Organic compound 1 with polymerizable unsaturated group | 20 | 20 | 20 | 20 | 20 | 20 |  |
|  | Organic compound 2 with polymerizable unsaturated group |  |  |  |  |  |  |  |
|  | Organic compound 3 with polymerizable unsaturated group |  |  |  |  |  |  |  |
|  | Organic compound 4 with polymerizable unsaturated group |  |  |  |  |  |  |  |
|  | Vinyl compound with polyphenylene ether skeleton |  |  |  |  |  |  |  |
|  | Bismaleimide |  |  |  |  |  |  |  |
|  | Epoxy compound |  |  |  |  |  |  |  |
|  | Elastomer 1 |  |  |  |  |  |  |  |
|  | Elastomer 2 |  |  |  |  |  |  |  |
|  | Elastomer 3 |  |  |  |  |  |  |  |
|  | Inorganic filler 1 | 50 | 100 | 150 | 250 |  |  |  |
|  | Inorganic filler 2 |  |  |  |  | 50 | 250 | 100 |
|  | Inorganic filler 3 |  |  |  |  |  |  |  |
|  | Thermo-radical polymerization initiator | 3 | 3 | 3 | 3 | 3 | 3 | 3 |
| Evaluation | Relative dielectric constant | 2.25 | 2.45 | 2.54 | 2.7 | 2.33 | 2.66 | 2.4 |
|  | Dielectric loss tangent | 0.0018 | 0.0019 | 0.0018 | 0.0019 | 0.0018 | 0.0022 | 0.0009 |
|  | Peel strength 1 (N/mm) | 0.5 | 0.6 | 0.7 | 0.6 | 0.6 | 0.7 | 0.6 |
|  | Peel strength 2 (N/mm) | 0.7 | 0.6 | 0.6 | 0.5 | 0.6 | 0.5 | 0.8 |
|  | Solder heat resistance 1 | A | A | A | A | A | A | A |
|  | Solder heat resistance 2 | A | A | A | A | A | A | A |

TABLE 2

| | | Example | | | | | | |
|---|---|---|---|---|---|---|---|---|
| | | 8 | 9 | 10 | 11 | 12 | 13 | 14 |
| Composition (parts by mass) | Copolymer 1 | 60 | 60 | 60 | 60 | 60 | 69 | 37.5 |
| | Copolymer 2 | 20 | 20 | 20 | 20 | 20 | 22 | 12.5 |
| | Copolymer 3 | | | | | | | |
| | Organic compound 1 with polymerizable unsaturated group | | | | 20 | 20 | 9 | 50 |
| | Organic compound 2 with polymerizable unsaturated group | 20 | | | | | | |
| | Organic compound 3 with polymerizable unsaturated group | | 20 | | | | | |
| | Organic compound 4 with polymerizable unsaturated group | | | 20 | | | | |
| | Vinyl compound with polyphenylene ether skeleton | | | | | | | |
| | Bismaleimide | | | | | | | |
| | Epoxy compound | | | | | | | |
| | Elastomer 1 | | | | | | | |
| | Elastomer 2 | | | | | | | |
| | Elastomer 3 | | | | | | | |
| | Inorganic filler 1 | 100 | 100 | 100 | 30 | 350 | 100 | 160 |
| | Inorganic filler 2 | | | | | | | |
| | Inorganic filler 3 | | | | | | | |
| | Thermo-radical polymerization initiator | 3 | 3 | 3 | 3 | 3 | 3 | 4.8 |
| Evaluation | Relative dielectric constant | 2.35 | 2.45 | 2.34 | 2.17 | 2.93 | 2.31 | 2.94 |
| | Dielectric loss tangent | 0.0012 | 0.0021 | 0.0019 | 0.0014 | 0.0015 | 0.0017 | 0.0019 |
| | Peel strength 1 (N/mm) | 0.5 | 0.6 | 0.6 | 0.9 | 0.5 | 0.7 | 0.5 |
| | Peel strength 2 (N/mm) | 0.6 | 0.7 | 0.6 | 1.2 | 0.5 | 0.8 | 0.6 |
| | Solder heat resistance 1 | A | A | B | A | A | B | A |
| | Solder heat resistance 2 | A | A | B | A | A | A | A |

TABLE 3

| | | Comparative Example | | | | | | | |
|---|---|---|---|---|---|---|---|---|---|
| | | 1 | 2 | 3 | 4 | 5 | 6 | 7 | 8 |
| Composition (parts by mass) | Copolymer 1 | 67 | | | | | | 60 | |
| | Copolymer 2 | 16.5 | | | | | | 20 | |
| | Copolymer 3 | | | | | | | | |
| | Organic compound 1 with polymerizable unsaturated group | 16.5 | | | | | | 20 | 20 |
| | Organic compound 2 with polymerizable unsaturated group | | | | | | | | |
| | Organic compound 3 with polymerizable unsaturated group | | | | | | | | |
| | Organic compound 4 with polymerizable unsaturated group | | | | | | | | |
| | Vinyl compound with polyphenylene ether skeleton | | 12.6 | 12.6 | 16 | 15 | 15 | | |
| | Bismaleimide | | 13.7 | 13.7 | 5 | 5 | 5 | | |
| | Epoxy compound | | | 5.3 | 5.3 | | 5 | 5 | |
| | Elastomer 1 | | 68.4 | | | | | | |
| | Elastomer 2 | | | 68.4 | | 75 | 75 | | 80 |
| | Elastomer 3 | | | | 79 | | | | |
| | Inorganic filler 1 | | | | | 50 | 100 | | 100 |
| | Inorganic filler 2 | | | | | | | | |
| | Inorganic filler 3 | | | | | | | 100 | |
| | Thermo-radical polymerization Initiator | 3 | | | | 2 | 2 | 3 | 3 |
| Evaluation | Relative dielectric constant | 2.1 | 2.3 | 2.4 | 2.3 | 2.5 | 2.6 | 2.52 | 2.5 |
| | Dielectric loss tangent | 0.0011 | 0.0006 | 0.0005 | 0.0002 | 0.0005 | 0.0005 | 0.0002 | 0.0021 |
| | Peel strength 1 (N/mm) | 0.7 | 0.5 | 0.5 | 0.1 | 1 | 1.4 | 0.6 | 0.8 |
| | Peel strength 2 (N/mm) | 1.2 | 0.6 | 0.7 | 0.1 | 1.2 | 1.3 | 0.8 | 1 |
| | Solder heat resistance 1 | C | C | C | C | A | A | C | C |
| | Solder heat resistance 2 | C | C | C | C | A | A | C | C |

As can be seen from Tables 1, 2, and 3, the thermosetting compositions of Examples 1 to 10, each containing an ethylene-propylene-diene copolymer (A) and an inorganic filler (B), have higher solder heat resistance ratings than the thermosetting composition of Comparative Example 1 containing no inorganic filler (B) and the thermosetting compositions of Comparative Examples 2 to 4 containing no ethylene-propylene-diene copolymer (A) or inorganic filler (B). In addition, the thermosetting compositions of Examples 1 to 10 have higher dielectric loss tangent ratings than thermosetting compositions of Comparative Examples 5 and 6 containing no ethylene-propylene-diene copolymer (A).

In addition, comparing Examples 1 to 6, each containing an inorganic filler (B) surface-treated with a surface treatment agent having a polymerizable unsaturated bond to Comparative Example 7 containing an inorganic filler surface-treated with a surface treatment agent having no polymerizable unsaturated bonds instead of the inorganic filler (B), it can be seen that the inorganic filler (B) surface-treated with a surface treatment agent having a polymerizable unsaturated bond does contribute to improving the solder heat resistance.

Furthermore, comparing Examples 1 to 6, each containing an ethylene-propylene-diene copolymer (A), to Comparative Example 8 containing no ethylene-propylene-diene copolymers (A), it can be seen that the ethylene-propylene-diene copolymer (A) does contribute to improving the solder heat resistance.

These results reveal that the cured product of the thermosetting composition, containing the ethylene-propylene-diene copolymer (A) and the inorganic filler (B) surface-treated with the surface treatment agent with the polymerizable unsaturated bond, should have a lower dielectric constant, a lower dielectric loss tangent, higher heat resistance, and a higher degree of adhesiveness with respect to a resin, than known ones.

The invention claimed is:

1. A sheet of metal foil with resin, comprising:
   a sheet of metal foil; and
   a resin layer laid on top of the sheet of metal foil,
   the resin layer including a dried product or semi-cured product of a thermosetting composition,
   the thermosetting composition comprising:
   an ethylene-propylene-diene copolymer as Component (A);
   an inorganic filler, as Component (B), surface-treated with a surface treatment agent having a polymerizable unsaturated bond, and
   as Component (C), an organic compound having a polymerizable unsaturated group.

2. The sheet of metal foil with resin of claim 1, wherein the content of the inorganic filler as the Component (B) falls within a range from 30 parts by mass to 500 parts by mass relative to 100 parts by mass of the ethylene-propylene-diene copolymer as the Component (A).

3. The sheet of metal foil with resin of claim 1, wherein the content of the organic compound as the Component (C) falls within a range from 1 part by mass to 100 parts by mass relative to 100 parts by mass of the ethylene-propylene-diene copolymer as the Component (A).

4. The sheet of metal foil with resin of claim 1, wherein the resin layer includes: a first resin layer stacked on the sheet of metal foil; and a second resin layer stacked on the first resin layer,
   the first resin layer contains at least one component selected from the group consisting of:
   a liquid crystal polymer;
   a polyimide;
   a polyamide imide;
   a fluorocarbon resin; and
   polyphenylene ether, and
   the second resin layer includes a dried product or semi-cured product of the thermosetting composition.

5. The sheet of metal foil with resin of claim 4, wherein the first resin layer has a thickness of 1 μm to 50 μm, and the second resin layer has a thickness of 5 μm to 200 μm.

* * * * *